United States Patent [19]
Cranford, Jr. et al.

[11] Patent Number: 5,416,443
[45] Date of Patent: May 16, 1995

[54] RELIABLE CLOCK SOURCE HAVING A PLURALITY OF REDUNDANT OSCILLATORS

[75] Inventors: H. Clay Cranford, Jr., Apex; Douglas E. Gill; Charles R. Hoffman, both of Raleigh, all of N.C.; Daniel W. J. Johnson, Round Rock, Tex.

[73] Assignee: International Business Machines Corporation, Armonk, N.Y.

[21] Appl. No.: 172,464

[22] Filed: Dec. 22, 1993

[51] Int. Cl.$^6$ .......................... H03L 7/06; H03L 7/07
[52] U.S. Cl. ............................ 331/2; 331/17; 331/18; 331/27; 331/49
[58] Field of Search ................. 331/2, 18, 49; 307/64, 307/65, 219; 328/61, 103, 104

[56] References Cited
U.S. PATENT DOCUMENTS

| | | | |
|---|---|---|---|
| 3,599,111 | 8/1971 | Butler et al. | 331/55 |
| 4,949,052 | 8/1990 | Kazumasa | 331/49 |
| 5,124,569 | 6/1992 | Phillips | 331/47 X |
| 5,235,292 | 8/1993 | Enolo et al. | 331/49 |

FOREIGN PATENT DOCUMENTS
917372 3/1982 U.S.S.R.

*Primary Examiner*—Siegfried H. Grimm
*Attorney, Agent, or Firm*—Steven B. Phillips; William G. Dossé

[57] ABSTRACT

A phase lock loop circuit (PLL) is manufactured as a part of each very large scale integrated circuit (VLSI) that might need clock pulses. When these VLSI chips are mounted on a printed circuit board (PC), three crystal oscillators are also mounted on the PC in order to provide redundancy. In order to identify crystal oscillators that are less desirable from the standpoint of operation and accuracy, a circuit is mounted on the PC for comparing oscillator frequencies and detecting when lack of frequency agreement is noted. A gating circuit receives the output of the detecting circuit for selecting and passing clock pulses only from a properly functioning crystal oscillator to the rest of the PC. Programmable counters are provided in the PLLs to allow local generation within each VLSI of clock pulses at a frequency that is a ratio of the frequency of the crystal-generated clock pulses that are circulated throughout the PC.

11 Claims, 8 Drawing Sheets

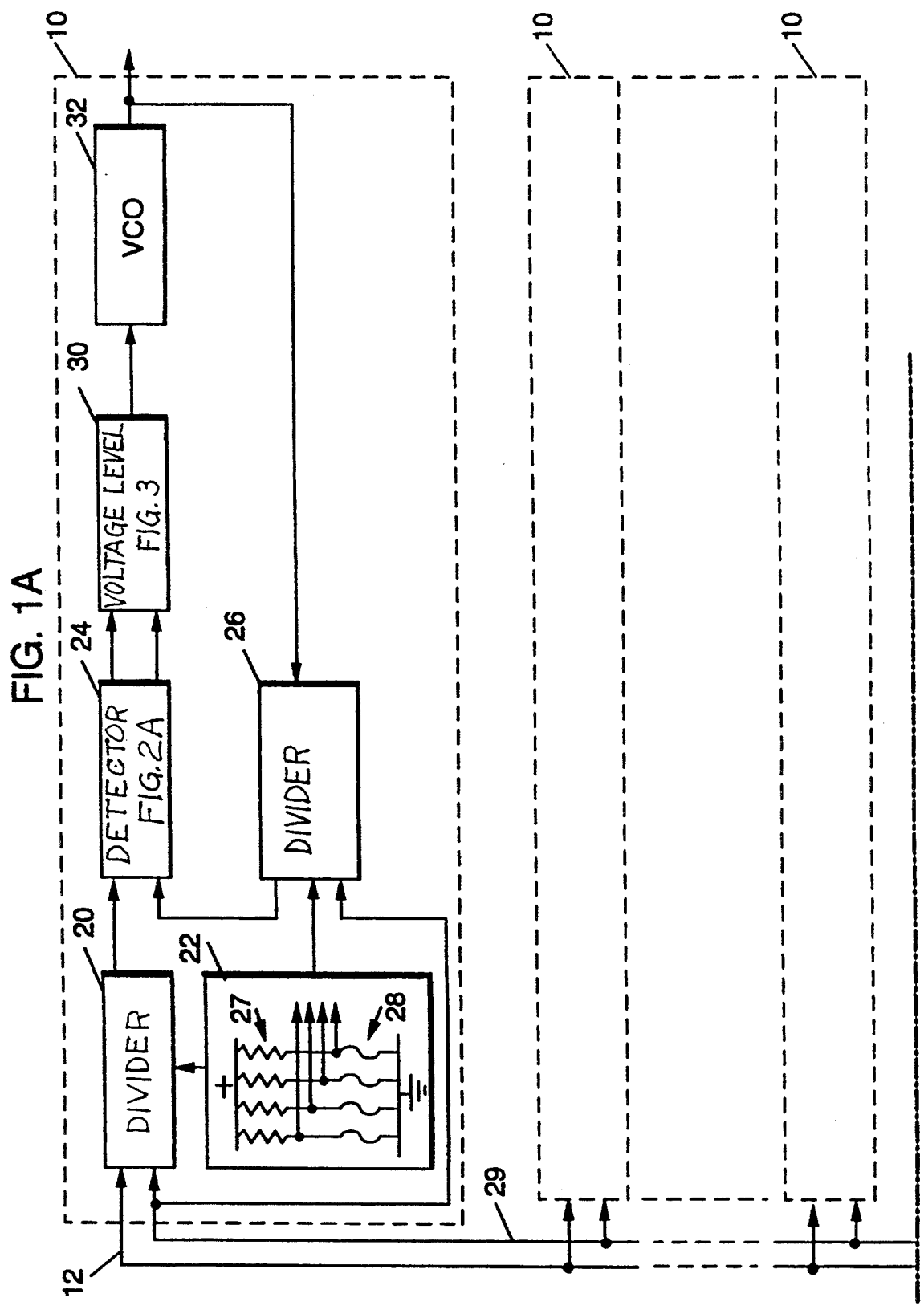

| FIG. 1A | FIG. 1B | FIG. 1C |

RELIABLE CLOCK SOURCE HAVING A PLURALITY OF REDUNDANT OSCILLATORS

TECHNICAL FIELD

The present invention relates to timing and clock circuits and systems and more particularly to an improved clock source for electronic circuits and systems, with enhanced reliability and flexibility of operation.

BACKGROUND OF THE INVENTION

The clocking circuits commonly used in electronic systems have traditionally derived their time bases directly from crystal oscillators, in order to exploit the high accuracy that is possible with a crystal oscillator. However, with continuing progress in the development of integrated circuits, the use of electromechanical components in electronic systems using integrated circuits has diminished greatly. The crystals used in oscillators are among the last of the electromechanical components used in electronic systems. Therefore, the crystal oscillator has become one of the least reliable components of most electronic systems.

At least three developments have occurred in the field of electronic circuits and systems which have made crystal-controlled clocking systems troublesome. Clocking rates, even in relatively inexpensive systems, have risen dramatically. Sending these high-frequency clock pulses coursing in conductors throughout an electronic system invites radio-like radiation and coupling of the clock pulses to functional signal conductors. Long conductors carrying very high frequency clock or timing pulses introduces a great potential for cross-talk and resultant disruption of the signal streams. Besides internal system problems from such radiation, the generation of and escape of such radiation might also exceed limits set by the U.S. FCC as well as the authorities of other countries.

The progress in microminiaturization of electronic components and circuits has further enhanced the potential for cross-talk of clock pulses into functional signal conductors by making the associated electrical components smaller. These smaller electronic components are thus more sensitive to small charges injected by cross-talk into their associated conductors.

As the integrated circuit components have gotten smaller, it would seem that their associated conductors would have gotten shorter and less likely to receive substantial amounts of cross-talk-linked electrical charge as a result of radiations from the high-frequency clock conductors. However, the sizes of systems have also grown. Therefore, the conductor lengths have not shortened as much as the component sizes have shrunk and the clock frequencies have increased.

One common approach to shortening the conductor paths that carry high-frequency clock pulses is to place a crystal oscillator next to each very large scale integrated circuit (VLSI). This can get expensive and uses an inordinate amount of circuit board area. The use of a great many individual crystal oscillators also multiplies the number of the less-reliable components that could fail and cause a system failure. That only compounds the reliability problem with the use of crystal oscillators. It also makes it difficult to control the phasing between the several VLSI chips in a system.

With so much integrated circuitry on a single printed circuit board, power budgeting can become a problem. If too many things happen simultaneously, current surges can be experienced by the various DC voltage sources that supply the printed circuit board.

There have been attempts to attack the crystal clock reliability problem by providing two or more crystal clocks. Then, various ways are found to choose the better of two—for example, by noting if one is going as much as half as fast as the other. Another approach is to rectify the output of the clock and look at the average voltage level of the rectified and filtered output. A low filtered output voltage means that the associated oscillator has either stopped or has slowed appreciably. Alternatively, three or more oscillators can be provided and their outputs compared. Then the two out of three that agree are selected, and one of those two is then used.

Most of the schemes that use multiple crystal oscillators and then switch between them pay little attention to the possible system consequences that might result from abrupt phase changes in the system clock.

SUMMARY OF THE INVENTION

It is an object of the present invention to enhance the reliability of a clock system for electronic circuits and systems by using a phase lock loop oscillator circuit to provide the final clock output signals having greater probability of accuracy from at least two high-accuracy fixed-frequency clock sources with means for detecting frequency differences between the fixed clock sources and for selecting from among the fixed clock sources the clock source most likely to be accurate and applying the output of that fixed clock source to the phase lock loop oscillator.

It is another object of the present invention to select out the less-reliable fixed-frequency clock sources by measuring minute deviations in clock rate.

It is still another object of the present invention to distribute lower frequency clock signals throughout an electronic system and then generate the higher frequencies only in the immediate vicinity of the circuits which need them, with accuracies based upon the lower frequencies being distributed.

Still yet another object of the present invention is to link the clock sources of the various circuits on a printed circuit board so as better to enable the control of the phasing of the clock pulses received by and used within the various integrated circuits, so as to coordinate the phasing of signal transmissions between the integrated circuits and to control the timing of events among the integrated circuits on a printed circuit board.

BRIEF DESCRIPTION OF THE DRAWINGS

For a more complete understanding of the nature and objects of the present invention, reference should be made to the following Detailed Description taken in connection with the accompanying Drawings in which.

DETAILED DESCRIPTION

Figure 1B:
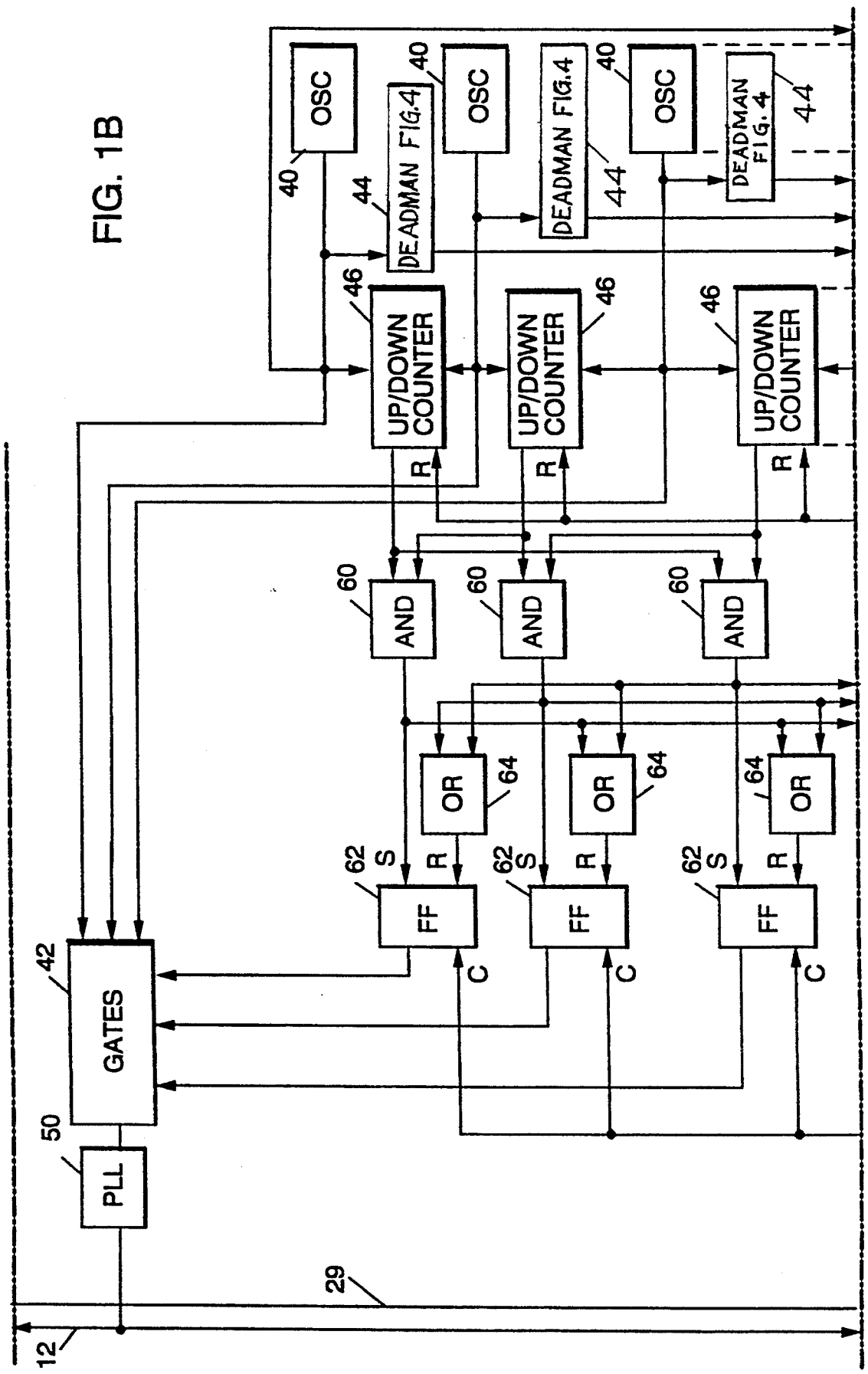
FIG. 1, shown as FIGS. 1A, 1B, and 1C on three separate sheets, is a schematic diagram of one of a plurality of phase lock loop oscillator circuits driven by one of a plurality of crystal oscillators, along with a circuit for selecting which crystal oscillator will be used.

Referring now to the accompanying drawings and more particularly to FIG. 1A, a plurality of phase lock loop oscillators (PLLs) 10 receive a fixed-frequency crystal-oscillator-controlled clock signal on a bus 12. The oscillators are all built to generate digital output signals (pulses) rather than analog (sinusoidal) output signals.

Each PLL includes a divider circuit 20 which is controlled by a fusible-link-program circuit 22 to issue one pulse for every N clock pulses that it receives from the bus 12. The number "N" can be the number "one." The divider 20 can be a binary counter that is externally or internally controllable to recycle (start from zero again) after any number of input pulses, up to the maximum count capability of the counter. The number N is a design-dependent integer, eg., four. Therefore, if the bus 12 carries a four megahertz (Mhz) clock signal, the output of the divider 20 is a one MHz clock signal, which is thus a derivative clock signal, derived from the crystal controlled clock signal on the bus 12.

The output of the divider 20 is one input of a phase and frequency detector circuit 24. The detector circuit 24 is shown and described in more detail in connection with FIG. 2A. The other input of the detector circuit 24 is provided by another divider circuit 26. The divider circuit 26 receives its input from the output of the PLL 10. If the divider circuit 26 is programmed by the program circuit 22 to divide by the number M, the frequency of the PLL's output clock pulses will be the frequency of the pulses on the bus 12, times M divided by N. For example, if the divider 26 is programmed such that M is twenty, an output from the PLL of 20 MHz will result (i.e., four MHz times twenty divided by four). Therefore, the twenty MHz output of the PLL 10 will result in a one MHz output from the divider 26 delivered to the other input of the detector 24. The detector 24 receives the one MHz outputs from the dividers 20 and 26 and produces output pulses on a pair of UP/DOWN outputs which represent the difference in phases and frequency that the detector 24 has detected between the counter outputs and delivers those difference pulses to a pulse-to-DC voltage level circuit 30.

The fusible-link-program circuit 22 is a simple arrangement of as many bias resistors 27 as are needed, connected to the same number of fusible links 28. The resistors 27, together with the links 28 that are connected individually in series with them, are connected between the positive voltage source of the system and the common return or ground. The juncture between each resistor 27 and its associated fusible link 28 is connected to one of the recycle program inputs of either the divider 20 or the divider 26. Alternatively, alterable components, such as, an on-chip electrically erasable programmable read-only memory (EEPROM) could be used to make this selection.

If a given program input of a divider is to receive a binary "1" program input at a given program input terminal, the link 28 is fused or melted and becomes an open-circuit component. Therefore, the associated resistor 27 holds that program input terminal to the positive supply voltage. If a binary "0" is required, the link is not fused but is left in the circuit and holds that program input terminal to ground voltage.

Both of the divider 20 and 26 are reset to a design-dependent count when power is turned on. That design-dependent count is to assure the proper phasing between the output pulses of the several PLLs 10. The power-on reset is carried to each PLL 10 on a reset bus 29.

The voltage level circuit 30 is a form of push-pull rectifier-filter and is shown and described in more detail in connection with FIG. 3. The output of the voltage level circuit 30 is a DC voltage level that is dependent upon whether the detector circuit 24 receives its input clock pulses from the divider 20 before or after the pulses from the divider 26. If the pulses from the two dividers are so badly out of phase as to suggest a significantly large difference in frequency between the pulses from the two dividers 20 and 26, the detector 24 controls the voltage level circuit 30 accordingly. An UP pulse from the detector 24 causes an increase in the control voltage applied by the voltage level circuit 30 to increase the frequency of the output of the PLL 10. A DOWN pulse causes a decrease in that control voltage and thus a decrease in the frequency of the output of the PLL 10.

The output of the voltage level circuit 30 provides the control input to a voltage-controlled oscillator (VCO) 32. The VCO 32 is an oscillator that generates a stream of output pulses at a frequency that is determined by the analog level of the DC voltage input to the VCO 32. VCOs are very common and are available in integrated circuit form, such as part number MC1648 available from Motorola, Inc. The output of the VCO 32 is the output of the PLL and is fed back to the divider 26 for comparison, at the detector 24, with the crystal-controlled clock pulses of the bus 12, as divided in the divider 20 (see above).

One PLL 10 can be located immediately adjacent to each VLSI chip on a printed circuit board in order that the four-MHz clock pulses can be distributed around the printed circuit board, rather than the 20 MHz clock pulses that might be needed by one or more of the VLSI chips. As a preferred alternative and as described more fully below in connection with FIG. 5, the PLL 10 can actually be manufactured on the VLSI chip. In this way no ultra-high-frequency pulses need circulate on the associated printed circuit board.

OSCILLATOR SELECTION

Figures 1, 1C:
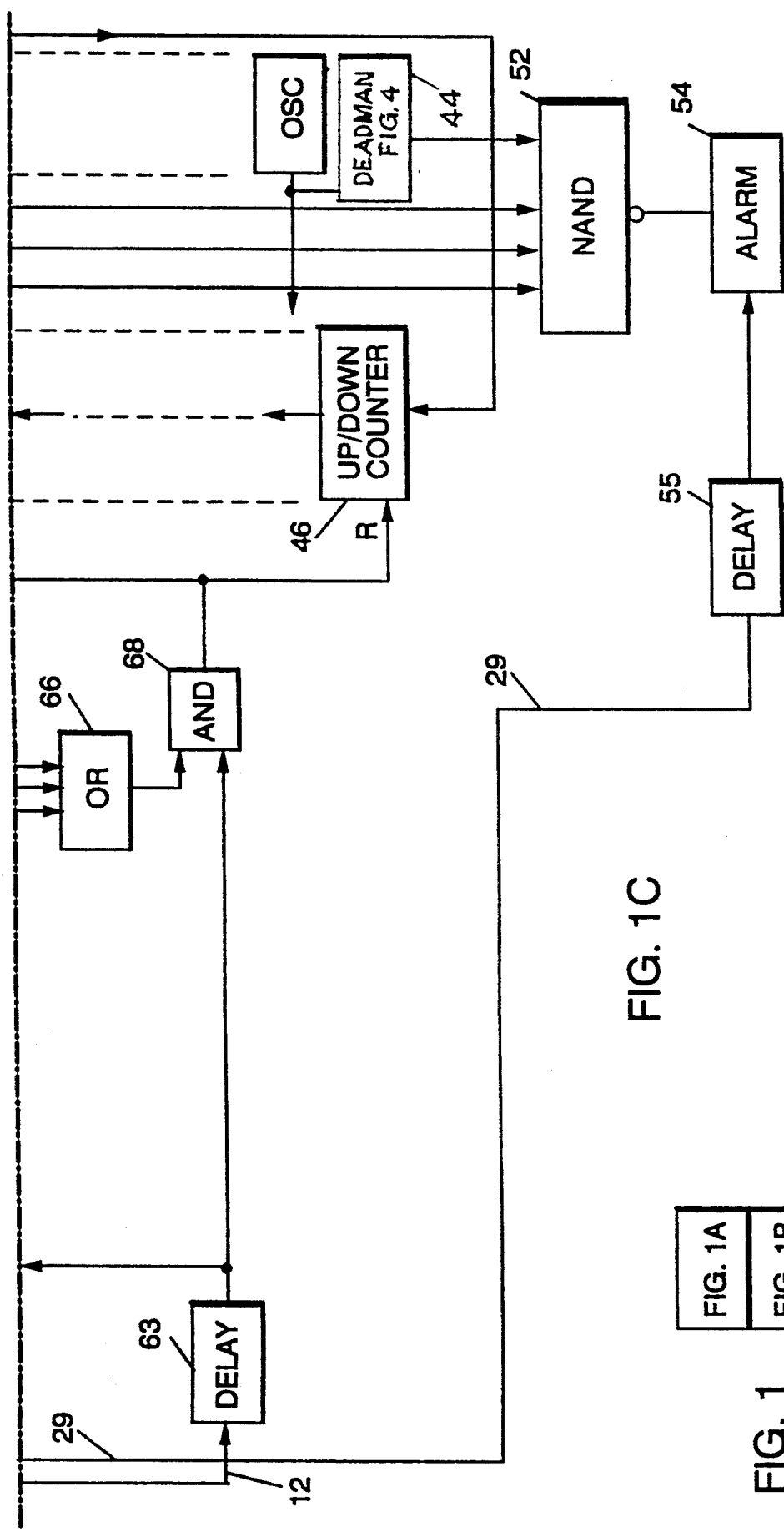

Referring now to FIGS. 1B and 1C, the logic circuit is shown for selecting which one of an indeterminate number of fixed-frequency crystal oscillators 40 is to be used as the accurate time base for a system clock. In practice, three oscillators 40 are usually enough. The oscillators 40 are arranged to provide clock pulses to a selection gate circuit 42 and to associated ones of the same number (eg., three) deadman circuits 44 and up-/down counter circuits 46. The selection gate 42 passes clock pulses from only one of the oscillators 40, preferably through an intermediate PLL 50, to the clock bus 12.

Each deadman circuit, which is described in greater detail in connection with FIG. 4, monitors the output of an associated oscillator 40. As long as all of the oscillators 40 produce clock pulses at a reasonable frequency, each deadman circuit 44 produces a binary "1" output to a NAND-gate 52. When an oscillator 40 fails to produce clock pulses at a reasonable frequency, its associated deadman circuit delivers a binary "0" to the NAND-gate 52. The NAND-gate 52 then delivers a binary "1" to an alarm circuit 54, which signals to a technician that there is a defective oscillator. In order to prevent an alarm during power-on start up, the power-on reset bus 29 delivers an inhibit signal to the alarm circuit, by reason of a delay 55, long enough for the deadman circuits 44 to recognize the presence of clock pulses from their respective oscillators 40 and settle to the binary "1" output state.

The UP/DOWN counters 46 are the first step in the logic system for determining if one of the oscillators 40 may be defective and is not to be used. At power on, each UP/DOWN counter 46 is reset (not shown) to a midpoint count. Each oscillator 40 increments one counter 46 with each clock pulse while the adjacent oscillator 40 decrements that same counter with each of its clock pulses. Therefore, each oscillator 40 increments one counter 46 and decrements an adjacent counter 46.

If two adjacent oscillators 40 were producing pulses at exactly the same frequency, the related counter 46 would never overflow, ie., exceed its count range. However, if two adjacent oscillators 40 are producing clock pulses at slightly different frequencies, eventually, their associated counter 46 will reach the end of its range, overflowing and issuing an alarm signal (a binary "1") to one of two inputs of an associated two of a plurality of AND-gates 60.

Since it is almost impossible for two oscillators 40 to run at exactly the same frequency over an extended period, eventually another pair of oscillators will have sufficiently different frequencies for their associated counter 46 (a second counter) to reach the end of its count. When that happens, that second counter sends a binary "1" signal to its associated two AND-gates 60.

In the case of three oscillators 40, as soon as a second counter 46 reaches the end of its count, one of the AND-gates 60 will have binary "1" s on both of its inputs and will thus produce a binary "1" output. That binary "1" output is the set priming input to one of a plurality (eg., three) binary latches 62 or flip flops. At the next clock pulse on the clock bus 12 (after a time interval determined by a delay 63, to prevent "race" conditions) that primed latch 62 is either set to or stays in its binary "1" state.

Meanwhile, the output of the selected AND gate 60 has sent a binary "1" signal to two OR-gates 64 associated with the reset priming inputs of the other two latches 62. Therefore, when the selected one latch is set to the binary "1" state, the other two latches are set to the binary "0" state.

The outputs of the three latches 62 are the selection inputs to the gates 42 and pass only the clock pulses from the oscillator 40 that was not associated with either of the UP/DOWN counters 46 that reached the end of their counts. That selected oscillator 40 is thus known to be the best of the three oscillators, as its frequency deviates least from the other two oscillators 40.

At the same time that an AND-gate 60 produces an output signifying that two counters 46 have reached the end of their counts, thus priming the latches 62, that selected AND-gate 60 sends a signal through an OR-gate 66. The binary "1" state at the output of the OR-gate 66 signifies that the latches 62 have been primed and the UP/DOWN counters 46 can be reset. Therefore, the output of the OR-gate 66 provides a binary "1" to one input of an AND-gate 68. The other input of the AND-gate 68 is provided by the same delayed clock pulse that sets the latches 62. Therefore, that delayed clock pulse is sent by the AND-gate 68 to reset all of the counters 46 for a repetition of the counting sequence.

The selection gate 42 can be as simple as a series of two-input AND-gates, one input of a given AND-gate being received from the associated oscillator 40 and the other input being received from the associated latch 62.

The purpose of using a PLL 50 between the gate circuit 42 and the clock bus 12 is to smooth out the phasing transitions that might occur when switching from one oscillator to another. Alternatively or additionally, the PLLs 10 can be constructed so as to lock into phase very slowly, thereby minimizing the likelihood of phasing problems between the PLLs 10 during and after the switch from one oscillator 40 to another.

DETECTOR 24

Figure 2A:
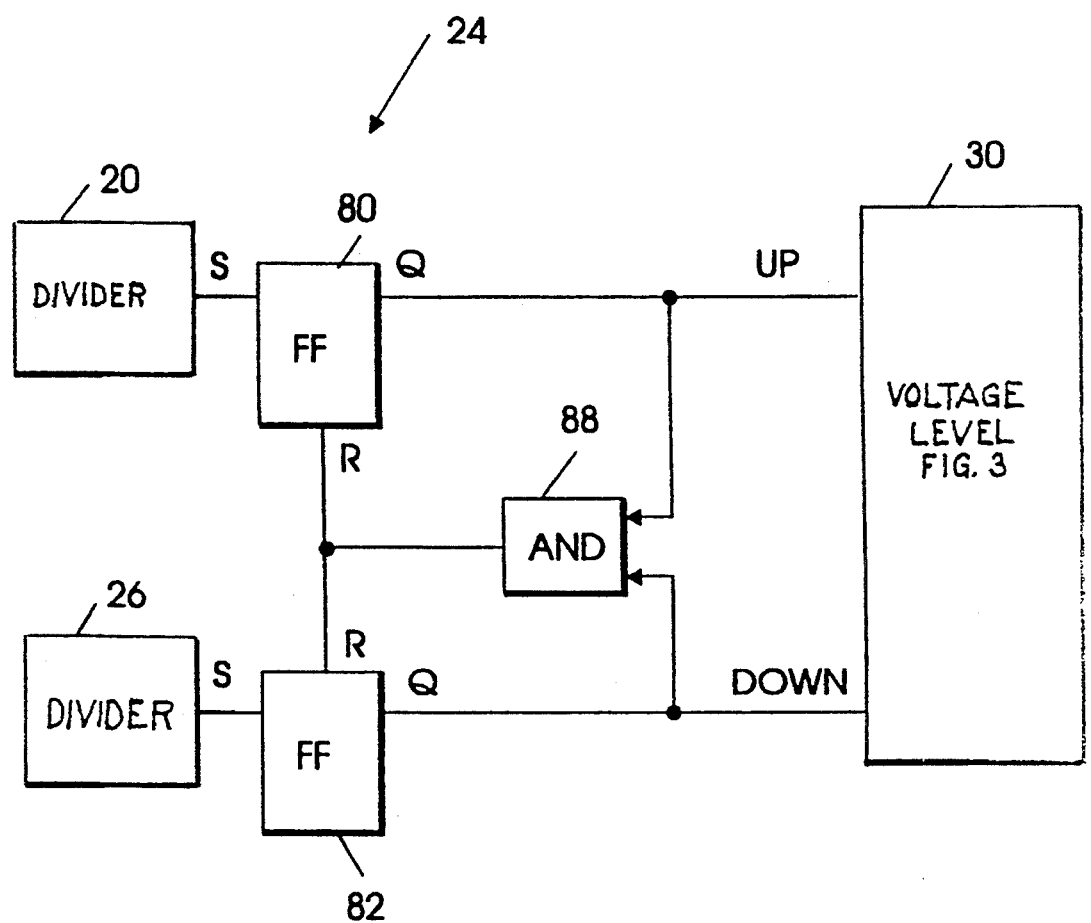
FIG. 2(A) is a schematic diagram of a circuit for performing the phase and frequency detection function within the phase lock loop circuits of FIG. 1, and FIGS. 2(B)–2(E) show the four output conditions from the circuit under four different relationships between the input pulse trains.

Referring now to FIG. 2A, the detector circuit 24 of FIG. 1A is shown in a more detailed schematic form, along with four timing diagrams (2(B)–2(E)), representing the outputs that would be obtained from different timing relationships between the two input pulse trains from outputs of the dividers 20 and 26. The output from the divider 20 is derived from the clock pulses on the bus 12 and is delivered to the set input of a bistable multivibrator or flip flop (FF) 80. The output from the divider 26 is derived from the output clock pulses from the VCO 32 and is delivered to the set input of another FF 82.

The FFs 80 and 82 are arranged to be set to their binary "1" state by negative-going transitions at their set inputs. Therefore, referring now to FIG. 2B, when the clock pulses from the output of the divider 20 are leading the clock pulses from the output of the divider 26, the two trains of clock pulses are out of phase. In order to draw the two trains of clock pulses into phase, the frequency of the output pulses of the VCO 32 must be increased very slightly until an in-phase condition is reached. It will be seen that there will be no significant UP or DOWN pulses delivered to the circuit 30 if the outputs of the dividers 20 and 26 are at the same frequency and in phase. That means that the output of the VCO is at the proper frequency and is in phase with the clock pulses on the bus 12.

Figure 2B:
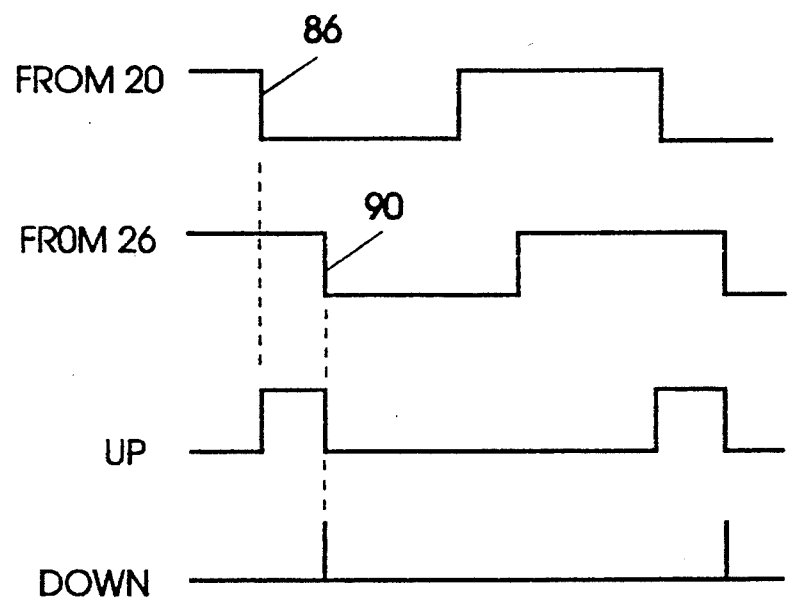

In order to achieve and maintain phasing, referring first to FIG. 2B, if the phase of the bus 12 clock pulses is leading phase of the VCO output pulses, the negative-going transition 86 of the clock pulse from the divider 20 sets the FF 80 to the binary "1" state. The output of the FF 80 then sends a binary "1" voltage to one input of a two-input AND-gate 88 and also on a frequency "UP" connection to the UP input of the voltage level circuit 30 (FIG. 3) to increase the frequency-control voltage to the VCO 32. The other input of the AND-gate 88 is connected to the output of the FF 82, which is still in the binary "0" state. Therefore, there is no output from the AND-gate 88 yet.

When the output from the divider 26 later experiences a negative-going transition 90, it sets the FF 82 to the binary "1" state. As soon as the FF 82 sets to the "1"

state, it provides the other "1" input to the AND-gate 88. The AND-gate 88 immediately provides a positive-going transition to the reset inputs of both FFs 80 and 82, resetting them to the binary "0" state.

The result is a positive-voltage pulse of substantial duration on the UP connection between the detector 24 and the voltage level circuit 30, thereby causing an increase in the voltage level output of the circuit 30, increasing the frequency of the VCO. However, there is also a positive-voltage spike of extremely short duration on the down connection between the detector 24 and the circuit 30. This voltage spike would tend to reduce the output voltage of the circuit 30, but that does not happen or it happens to only an insignificant extent.

Figure 3:
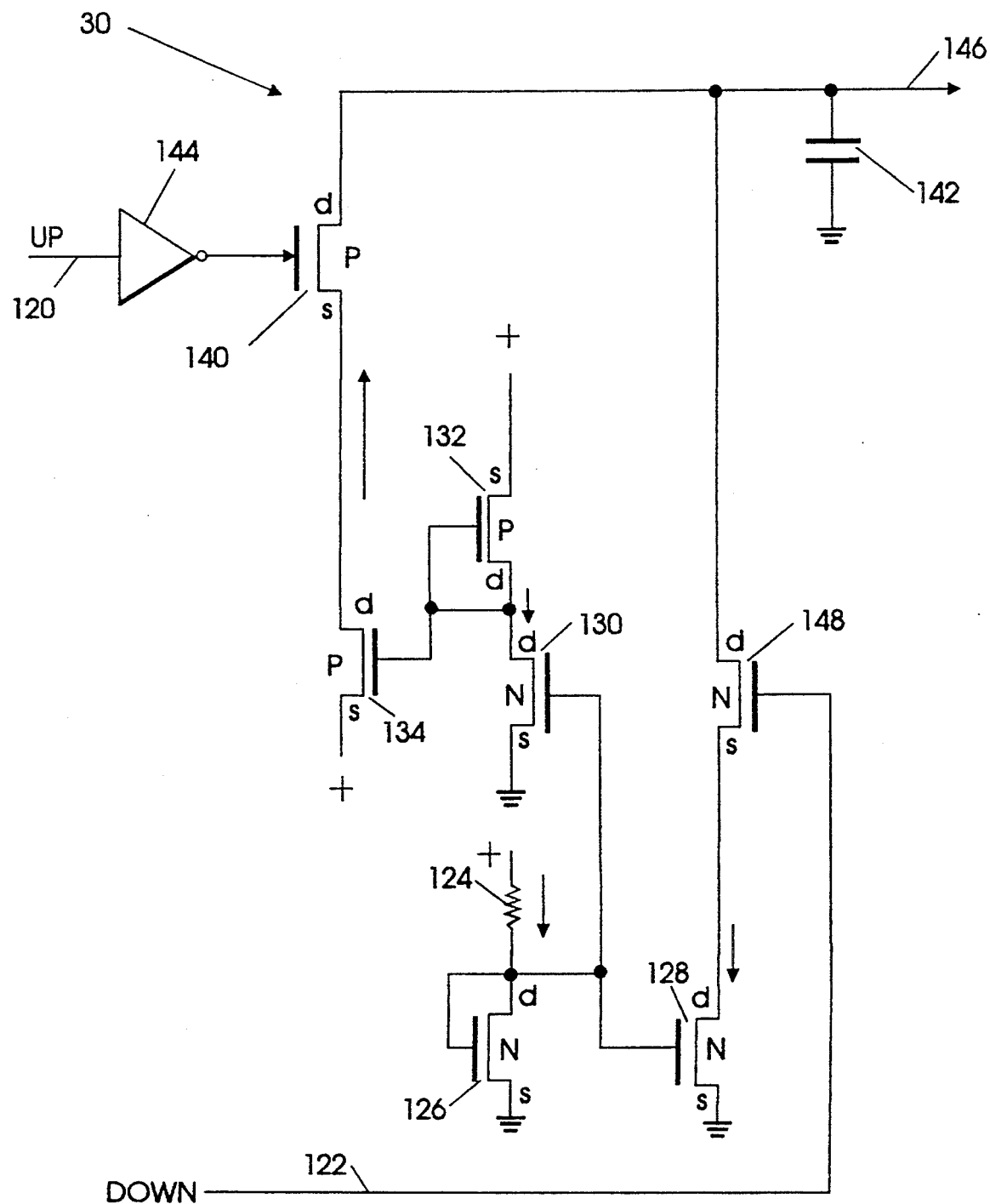
FIG. 3 is a schematic diagram of the pulse-to-DC voltage level (charge pump) circuit that is used to generate the voltage levels that control the voltage-controlled oscillator of the phase lock loop circuit of FIG. 1.

The circuit 30, as explained below in connection with FIG. 3, is a circuit made up of field effect transistors (FETs). The control terminal of a FET is its gate. The gate of a FET is capacitive in nature. By definition, the voltage across a capacitor can not be changed instantaneously. Therefore, if the gate capacitance of the FET 20 of the circuit 30 that is connected to the DOWN connector from the output of the FF 82 is large enough, the very brief voltage spike could be lost in that capacitance. However, even if there is some conduction within the circuit 30 by reason of the brief voltage spike from the output of the FF 82, any resultant reduction in the output voltage level of the circuit 30 would be insignificant compared with the voltage-increasing effect of the UP pulse (see FIG. 2B) from the output of the FF 80.

Figure 2C:
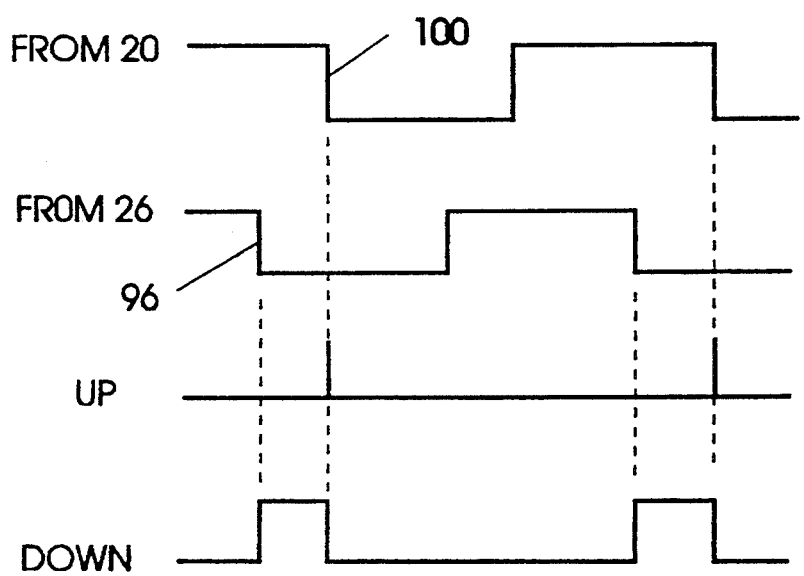

Referring now to FIG. 2C, the output from the divider 26 is leading the output from the divider 20, and the VCO must be slowed down just slightly. Therefore, the negative-going transition 96 sets the FF 82 to the "1" state and produces a DOWN pulse to the circuit 30. The later-occurring, negative-going transition 100 at the output of the divider 20 sets the FF 80 to the "1" state, resetting both FFs 80 and 82 through the AND-gate 88. The result is a substantial DOWN pulse at the DOWN input of the circuit 30 and a negligible voltage spike at the UP input of the voltage level circuit 30. The substantial DOWN pulse reduces the control voltage supplied by the circuit 30 to the VCO 32 and thus lowers the frequency of the output pulses from the VCO 32, tending to draw the VCO output into phase.

Figure 2D:
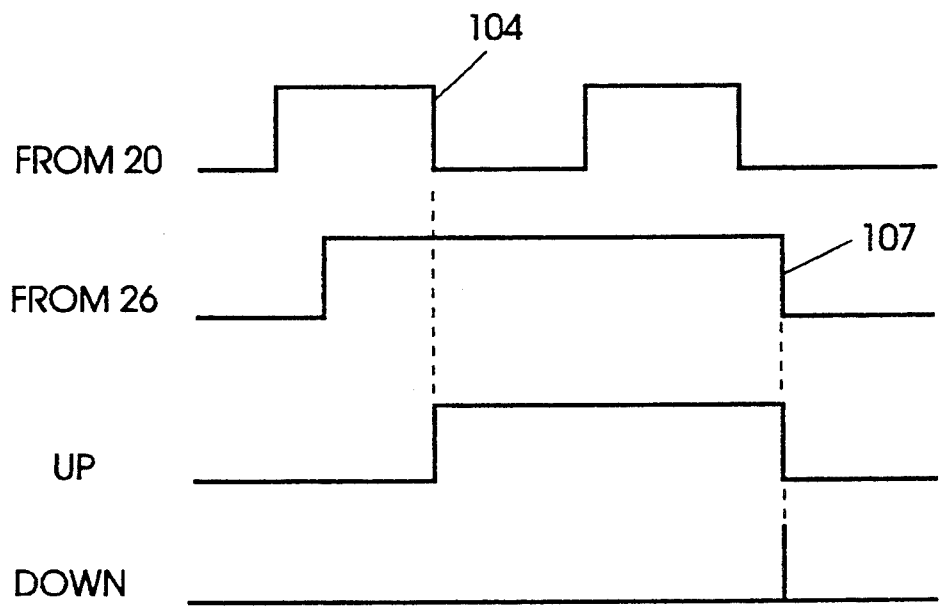

Referring now to FIG. 2D, the output pulses from the divider 20 are at a substantially higher frequency than the output pulses from the divider 26. While the difference between these pulse widths and their frequencies are shown exaggerated in FIG. 2D, they serve to illustrate what would be only a very slight frequency difference. The negative-going transition 104 at the output of the divider 20 sets the FF 80 and produces an UP pulse to the circuit 30. The next negative-going transition 107 of the output from the divider 26 does not occur for some time. When it does occur, it ends the UP pulse, which by this time is much longer than the UP pulse shown in FIG. 2A. Therefore, the circuit 30 raises the control voltage to the VCO 32 by a significantly greater magnitude than was the case with the shorter UP pulse of FIG. 2A. The resultant more substantial increase in the output frequency of the VCO is needed in order more rapidly to correct the more gross difference in the frequency of the pulses from the dividers 20 and 26.

Figure 2E:
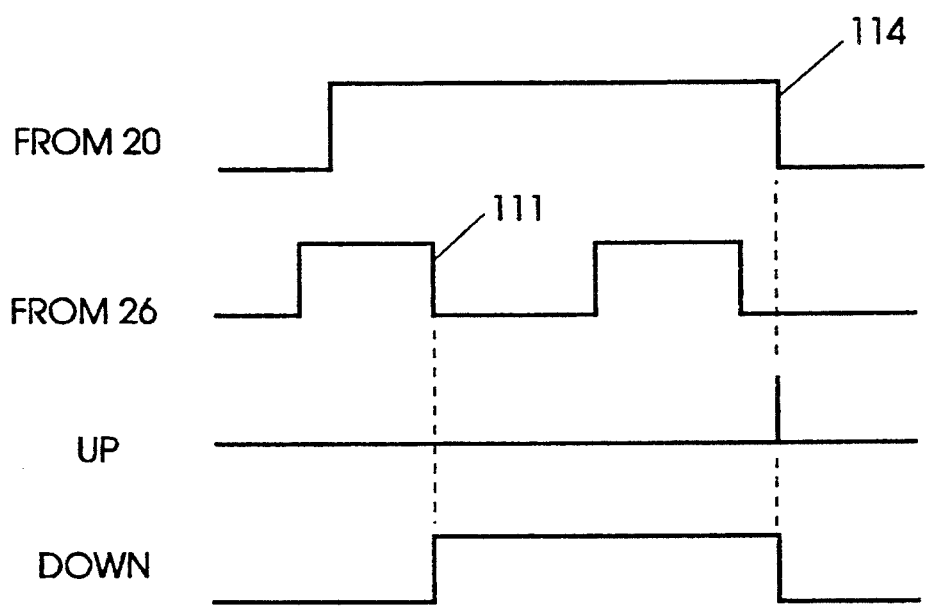

Referring now to FIG. 2E, the VCO is running substantially too fast and must be slowed relatively more than in the example of FIG. 2C. The negative-going transition 111 sets the FF 82 and starts a DOWN pulse to the circuit 30. The next negative-going transition 114 sets the FF 80 which resets both FFs 80 and 82, ending the long DOWN pulse.

VOLTAGE LEVEL CIRCUIT 30 (CHARGE PUMP)

Referring now to FIG. 3, the voltage level circuit 30 (sometimes referred to as a "charge pump") of FIG. 1 is shown in schematic form, with field effect transistors (FETs) as the active circuit components. The voltage level circuit 30 receives up/down pulses from the detector 24 (FIG. 1) on two inputs, an UP input 120 and a DOWN input 122.

Positive supply voltage is applied to one terminal of a voltage divider resistor 124, the other terminal of which is attached to the drain terminal of an N-channel field effect transistor (FET) 126. In accordance with common usage, in an N-channel FET, the drain is the conduction terminal with the more positive bias voltage; while, in a P-channel FET, the drain is the conduction terminal with the more negative bias voltage.

The source terminal of the FET 126 is connected to a common return or ground, and the gate terminal of the FET 126 is connected to its drain terminal. Therefore, the FET 126 is biased to the ON condition. The amount of current passing through the resistor 124 and the FET 126 is determined by the resistance of the resistor 124 and the gate-to-drain voltage vs. current flow characteristics of the FET 126. That voltage vs. current flow characteristic produces the effect of another resistor for the voltage divider circuit. The threshold voltage of a FET is the voltage by which the gate of a FET must exceed the voltage of its drain before current flow between the source and the drain terminals will just begin. Because it is between the two impedances of a voltage divider circuit, the drain of FET 126 provides a useful reference voltage with respect to the common or ground of the system.

The drain of the FET 126 is connected to the gate terminals of two other N-channel FETs 128 and 130. This connection places the reference voltage from the drain of FET 126 on both of the FETs 128 and 130, causing them to begin to conduct current whenever their gates exceed the reference voltage by an amount equal to the threshold voltage of those FETs.

The drain of the FET 130 is connected to the drain of a P-channel FET 132. The source terminal of the FET 132 is connected to the positive voltage source, and its gate terminal is connected to its drain. Therefore, like the FET 126, but in the opposite polarity, the FET 132 conducts current whenever its gate voltage (and also its drain voltage) is algebraically less than the voltage of the positive voltage source by an amount at least equal to the threshold voltage of the FET 132.

Since the voltage of the gate of the FET 130 is set by the reference voltage at the drain of FET 126, that causes the same reference value of current to flow through both of the FETs 126 and 130. Since the reference current flows through the FET 132, a P-channel reference voltage (which may differ from the reference voltage across the FET 126) is established for the source-drain path of the FET 132. That reference voltage on the drain of the FET 132 provides a mirror current of the reference current at the drain of the FET 126.

The reference voltage from the drain of the FET 132 is applied to the gate of another P-channel FET 134.

The source of the FET 134 is connected to the positive voltage source.

Consequently, the FETs 128 and 134 act as prospective current sources. That is, they conduct current (of the proper polarity) of a magnitude set by the associated reference voltages and their threshold voltages.

The drain of FET 134 is connected to the source of a P-channel FET 140, the drain of which is connected to a filter capacitor 142. The gate of the FET 140 is connected through an inverter 144 to the UP input 120. Therefore, the gate of the FET 140 is normally held at the voltage of the positive voltage supply by a zero-volt or ground condition of the UP input 120. Consequently, no current then flows to or from the capacitor 142 through the FET 140.

When a positive-voltage pulse is present on the UP input 120, the inverter 144 places a ground voltage pulse on the gate of the FET 140, making it more negative than its source terminal, by at least the amount of its threshold voltage. Current then flows from the positive voltage supply to the filter capacitor 142 (eg., it pumps positive charge into the terminal of the capacitor 142 that is connected to the drain of FET 140).

The flow of such current into the capacitor 142 increases its voltage over the common or ground. That voltage on the capacitor 142 is also applied at the output 146 of the voltage level circuit 30, which is connected to the control voltage input of the VCO 32 (FIG. 1A). Increasing the control voltage to the VCO increases (or UPs) the frequency of its output clock pulses.

Conversely, the source of an N-channel FET 148 is connected to the drain of the FET 128. The drain of the FET 148 is connected to the capacitor 142 and to the output 146. The gate of the FET 148 is connected to the DOWN input 122. Therefore, when the DOWN input is at ground voltage, no current flows through the FETs 128 and 148. However, when a positive-voltage pulse is present on the DOWN input 122, it turns on the FETs 128 and 148 and draws current from the capacitor 142, to ground. This reduces the voltage of the capacitor 142 and also the voltage output to the VCO 32 (FIG. 1A), thereby reducing the frequency of the output pulses of the VCO.

DEADMAN CIRCUIT

Figure 4:
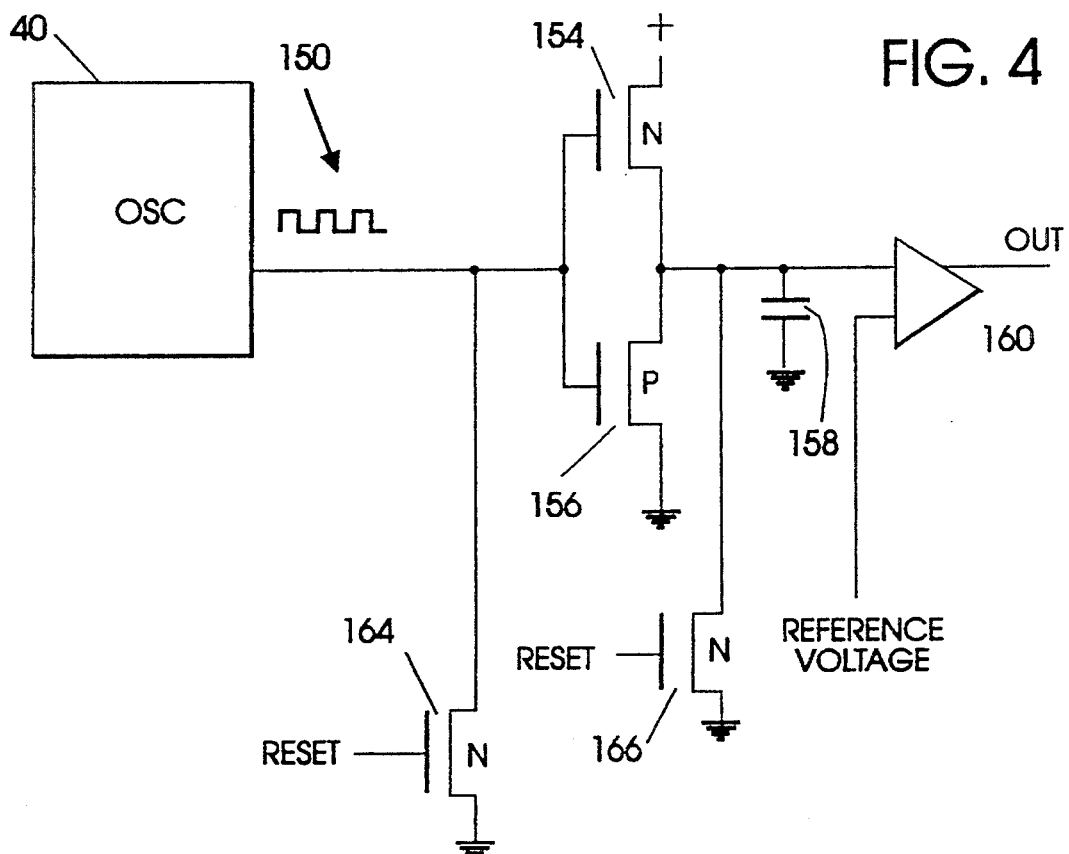
FIG. 4 is the circuit used to determine if a crystal oscillator is functioning at all.

Referring now to FIG. 4, the deadman circuit 44 of FIGS. 1B and 1C is shown in schematic form as a FET-operated detector circuit. Timing pulses 150 from an associated oscillator 40 are delivered to the gates of an N-channel FET 154, the conductive path of which is connected in series with the conductive path of a P-channel FET 156. The drain of the FET 154 is connected to the positive voltage supply, and the source of the FET 154 is connected to the source of the FET 156. The drain of FET 156 is connected to ground. The sources of the FETs 154 and 156 are also connected to a terminal of a capacitor 158, the other terminal of which is connected to ground.

When the clock pulses 150 are present at the gates of the FETs 154 and 156, they are positive pulses at nearly the voltage of the positive voltage supply, over a ground reference voltage.

The FET 154 is a normal logic device which has a normal current flow characteristic. The FET 156 has a very small current flow, even when it is in a fully-conducting condition. The nearly ground voltage of the clock output normally keeps the FET 156 conducting a small amount of current from the positively-charged capacitor 158 to ground, tending to discharge the capacitor 158.

However, when a nearly positive-supply-voltage clock pulse is present at the gates of the FETs 154 and 156, it not only turns off the FET 156; it also causes the FET 154 to go into conduction. The normal level of conduction through the FET 154 rapidly charges the capacitor 158 toward the voltage of the positive supply.

As long as positive-voltage clock pulses 150 are present in rapid succession, the capacitor 158 is kept charged to a high positive voltage. A comparator 160 compares the voltage on the capacitor 158 with a reference voltage, which might be generated in a manner similar to the generation of reference voltages described in connection with FIG. 3. As long as the positive voltage present on the capacitor 158 is above the reference voltage, the comparator 160 produces a binary "1" output, indicating that the associated oscillator 40 is properly producing clock pulses 150.

However, if the associated oscillator 40 stops producing clock pulses 150, the nearly-ground voltage at the gates of the FETs 154 and 156 soon causes the capacitor to discharge to a voltage below the reference voltage; and the comparator 160 will produce an output that represents a binary "0".

When power is turned ON for the system, the reset bus 29 (FIG. 1) also applies positive reset voltage to the gates of two reset N-channel FETs 164 and 166, turning them ON. The drain of the FET 164 is connected to the gates of the FETs 154 and 156, which are held at nearly ground voltage when the FET 164 is conducting. The drain of the FET 166 is connected to the capacitor 158 and assures that the capacitor 158 is discharged to ground voltage whenever FET 166 is conductive. Therefore, when the power-ON reset pulse ends, the deadman circuit of FIG. 4 can begin operation, as described above.

PC BOARD LAYOUT

Figure 5:
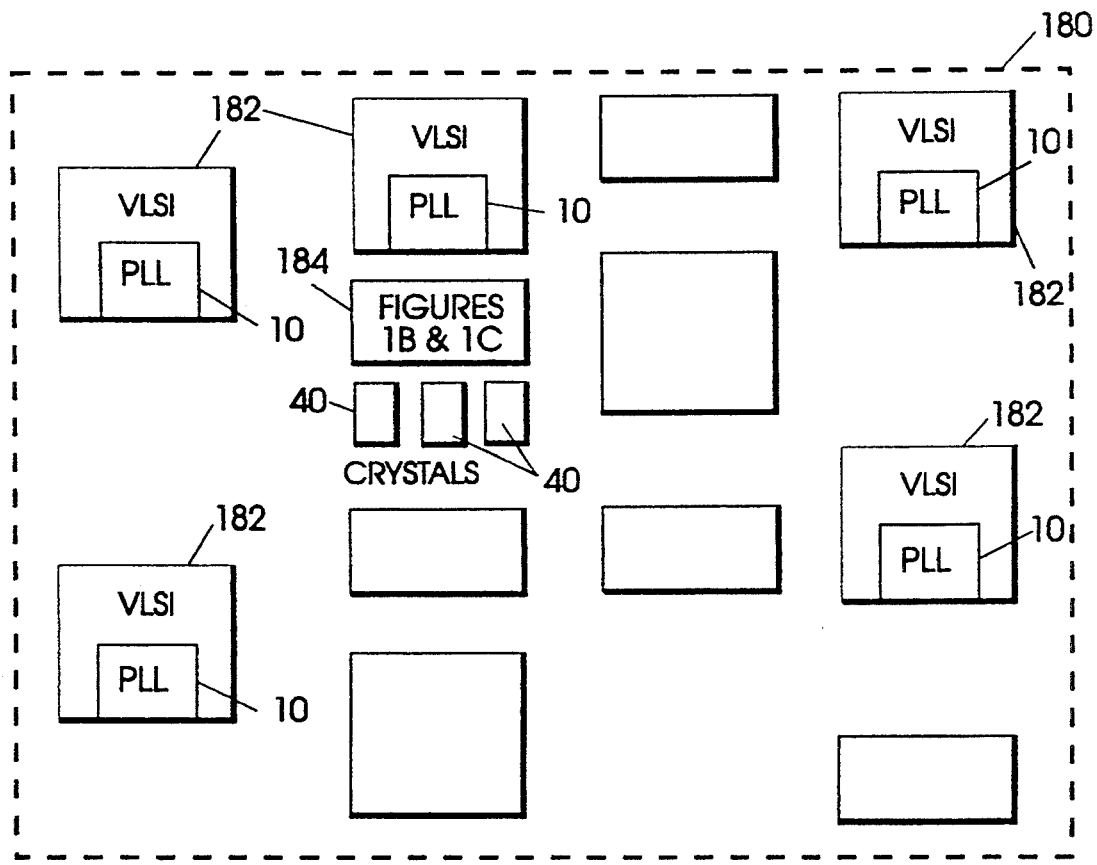
FIG. 5 is a pictorial layout diagram of a printed circuit board configured to take advantage of the present invention.

Referring now to FIG. 5, there is shown a pictorial layout of the surface of an exemplary printed circuit board (PC) 180 populated with several VLSI integrated circuit chips 182. Typically, each VLSI 182 requires clock pulses at a frequency that may differ from the frequency needed by one or more of the other VLSIs 182. Yet, it may be necessary to control the phasing of the clock pulses utilized by the several VLSIs 182, in order to obviate excessive use of data buffers on the inputs and perhaps the outputs of each VLSI 182.

Three crystal oscillators 40 are mounted on the PC 180. The selector circuit 184 (see FIGS. 1B and 1C) selects which oscillator 40 will furnish the clock pulses that are circulated, on the bus 12 (not shown in FIG. 5), about the PC 180. Each VLSI 182 has, built right into its integrated circuit chip, a PLL 10 (see FIG. 1A) which receives the clock pulses on the bus 12 (FIG. 1A) and synthesizes the higher frequency clock pulses needed by that VLSI 182. Therefore, the higher frequency clock pulses are never present on the PC 180, and all of the clock pulses within the several VLSIs 182 can be synchronized with each other since they are all derived or synthesized from the same lower-frequency clock that is circulated about the PC 180, from the selector circuit 184.

While the present invention has been described with respect to certain preferred embodiments thereof, it is to be understood that numerous variations in the details of construction, the arrangement and combination of parts, and the type of materials used may be made without departing from the spirit and scope of the invention.

What is claimed is:

1. A high reliability clock source comprising:
   a plurality of fixed-frequency oscillators, all having outputs with the same nominal frequency, when they are operating properly;
   difference detecting means associated with said fixed oscillators for detecting a difference in frequency between the fixed-frequency oscillators;
   a phase lock loop having an input and an output; and
   selecting means responsive to the difference detecting means for selecting which fixed-frequency oscillator will have its output connected to the input of the phase lock loop.

2. A clock source according to claim 1, wherein the selecting means includes:
   function detecting means for detecting if any fixed-frequency oscillator is not producing output pulses at a frequency that is at least a minimum frequency that is less than the nominal frequency; and
   means responsive to the function detecting means for preventing selecting of the output of that fixed-frequency oscillator.

3. A clock source according to claim 1, wherein the selecting means includes:
   means for choosing one of the fixed-frequency oscillators having an output frequency that differs the least from the output frequency of at least one other fixed-frequency oscillator.

4. A clock source according to claim 1, wherein the selecting means includes:
   function detecting means for detecting if any fixed-frequency oscillator is not producing output pulses at a frequency that is at least a minimum frequency that is less than the nominal frequency;
   means responsive to the function detecting means for preventing selecting of the output of that fixed-frequency oscillator; and
   means for choosing one of the fixed-frequency oscillators having an output frequency that differs the least from the output frequency of at least one other fixed-frequency oscillator.

5. A clock source according to claim 1, wherein the phase lock loop further includes:
   dividing means for generating output pulses at a frequency that is an integer division of the frequency of the output pulses of the phase lock loop.

6. A clock source according to claim 5, wherein the phase lock loop includes:
   means for comparing the phasing and frequency of the output pulses of the dividing means with the phasing and frequency of the output pulses from the selected fixed oscillator.

7. A clock source according to claim 1, wherein the phase lock loop comprises:
   dividing means for generating output pulses at a frequency that is an integer division of the frequency of the output pulses of the phase lock loop; and
   means for comparing the phasing and frequency of the output pulses of the dividing means with the phasing and frequency of input pulses derived from the selected fixed oscillator.

8. A clock source according to claim 7, further including:
   deriving means for generating derived pulses at a frequency that is an integer division of the frequency of the input pulses from the selected fixed oscillator and for delivering said generated derived pulses to the comparing means.

9. A printed circuit board component layout comprising:
   a plurality of functional integrated circuits;
   a plurality of highly-accurate, fixed-frequency oscillators, each having an output for timing pulses;
   a plurality of phase lock loop circuits, each having an input for timing pulses and each having an output associated with and furnishing clock pulses to one of the functional integrated circuits; and
   selecting circuit means for monitoring the outputs of the fixed-frequency oscillators and for selecting which of the fixed-frequency oscillator outputs will be delivered to the inputs of the phase lock loop circuits.

10. A printed circuit board component layout according to claim 9, wherein each phase lock loop is mounted on and integrally manufactured with its associated functional integrated circuit.

11. A clock source according to claim 1, further comprising:
    output sensing means associated with each fixed oscillator for detecting if it is failing to produce an output; and
    alarm means responsive to the output sensing means for issuing a warning indication when the output sensing means detects that a fixed oscillator has failed to produce an output.

* * * * *